(12) United States Patent
Lin et al.

(10) Patent No.: US 11,997,783 B2
(45) Date of Patent: May 28, 2024

(54) ELECTRONIC DEVICES

(71) Applicant: Advanced Semiconductor Engineering, Inc., Kaohsiung (TW)

(72) Inventors: Po-An Lin, Kaohsiung (TW); Huei-Shyong Cho, Kaohsiung (TW); Shih-Wen Lu, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 17/827,546

(22) Filed: May 27, 2022

(65) Prior Publication Data

US 2023/0389173 A1    Nov. 30, 2023

(51) Int. Cl.
*H05K 1/16* (2006.01)
*H05K 1/02* (2006.01)

(52) U.S. Cl.
CPC ............... *H05K 1/024* (2013.01); *H05K 1/16* (2013.01); *H05K 2201/10098* (2013.01)

(58) Field of Classification Search
CPC ....... H05K 5/0273; H05K 2201/10098; H05K 1/024; H05K 1/16
See application file for complete search history.

(56) References Cited

U.S. PATENT DOCUMENTS

| | | | |
|---|---|---|---|
| 2019/0207304 A1* | 7/2019 | Kim | H01L 24/25 |
| 2020/0098709 A1* | 3/2020 | Lin | H01L 21/4853 |
| 2020/0196440 A1* | 6/2020 | Tseng | H05K 1/181 |
| 2020/0328518 A1* | 10/2020 | Park | H01Q 9/0414 |
| 2021/0066814 A1 | 3/2021 | Kim et al. | |

* cited by examiner

*Primary Examiner* — Hoa C Nguyen

(74) *Attorney, Agent, or Firm* — FOLEY & LARDNER LLP

(57) ABSTRACT

The present disclosure provides an electronic device. The electronic device includes a first insulating layer, a first antenna pattern, a second insulating layer, and a second antenna pattern. The first antenna pattern is configured to operate at a first frequency and at least partially disposed over the first insulating layer. The second insulating layer is disposed over the first insulating layer. The second antenna pattern is configured to operate at a second frequency different from the first frequency and at least partially disposed over the second insulating layer. A dielectric constant of the first insulating layer is different from a dielectric constant of the second insulating layer.

6 Claims, 13 Drawing Sheets

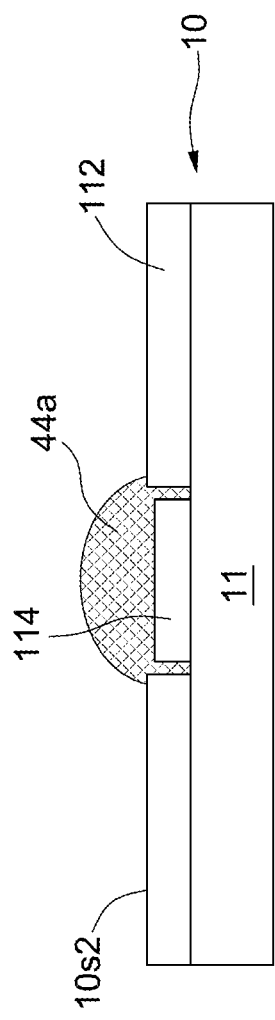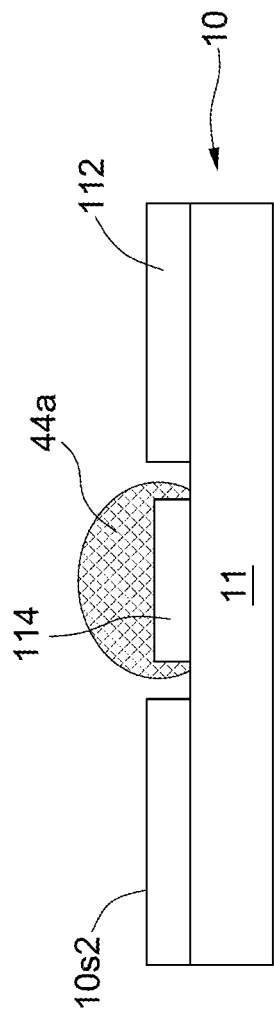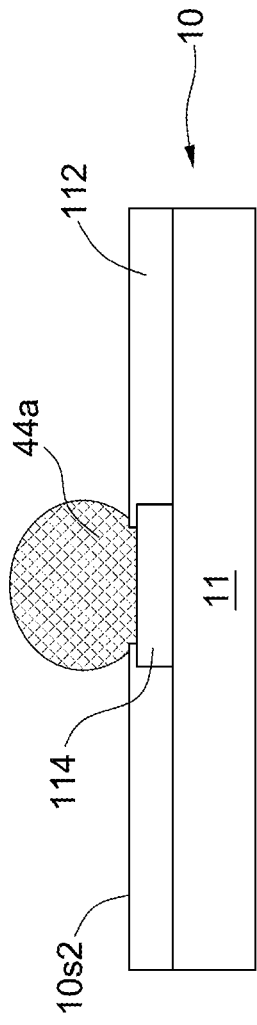

ELECTRONIC DEVICES

BACKGROUND

1. Field of the Disclosure

The present disclosure generally relates to an electronic device and a method of manufacturing an electronic device.

2. Description of the Related Art

To reduce the size and achieve higher integration of electronic device packages, several packaging solutions, such as antenna in package (AiP) and antenna on package (AoP) have been developed and implemented.

However, to support the industry's demand for increased electronic functionality, the size and/or form factor of the electronic device packages will inevitably be increased, and some applications may be limited (e.g., in portable devices).

SUMMARY

In some embodiments, an electronic device includes a first insulating layer, a first antenna pattern, a second insulating layer, and a second antenna pattern. The first antenna pattern is configured to operate at a first frequency and at least partially disposed over the first insulating layer. The second insulating layer is disposed over the first insulating layer. The second antenna pattern is configured to operate at a second frequency different from the first frequency and at least partially disposed over the second insulating layer. A dielectric constant of the first insulating layer is different from a dielectric constant of the second insulating layer.

In some embodiments, an electronic device includes a first insulating layer, a first antenna pattern, a second insulating layer, a second antenna pattern, and a circuit structure. The first insulating layer has a first dielectric constant. The first antenna pattern is at least partially disposed over the first insulating layer. The second insulating layer is disposed over the first insulating layer and has a second dielectric constant. The second antenna pattern is at least partially disposed over the second insulating layer. The circuit structure includes a third insulating layer and has a third dielectric constant, wherein a difference between the first dielectric constant and the third dielectric constant is less than a difference between the first dielectric constant and the second dielectric constant.

In some embodiments, an electronic device includes a first insulating layer, a first antenna pattern, a second insulating layer, a second antenna pattern, and an encapsulant. The first antenna pattern is at least partially disposed over the first insulating layer. The second insulating layer is disposed over the first insulating layer and has a second dielectric constant. The second antenna pattern is at least partially disposed over the second insulating layer. The encapsulant is disposed over the second insulating layer and has a third dielectric constant. A difference between the third dielectric constant and the second dielectric constant is greater than a difference between the third dielectric constant and the first dielectric constant.

BRIEF DESCRIPTION OF THE DRAWINGS

Aspects of some embodiments of the present disclosure are best understood from the following detailed description when read with the accompanying figures. It is noted that various structures may not be drawn to scale, and dimensions of the various structures may be arbitrarily increased or reduced for clarity of discussion.

FIG. 6A is an enlarged view of region R1 as shown in FIG. 1A, in accordance with an embodiment of the present disclosure.

FIG. 6B is a cross-sectional view of an electronic device, in accordance with an embodiment of the present disclosure.

FIG. 6C is a cross-sectional view of an electronic device, in accordance with an embodiment of the present disclosure.

DETAILED DESCRIPTION

Figure 1A:
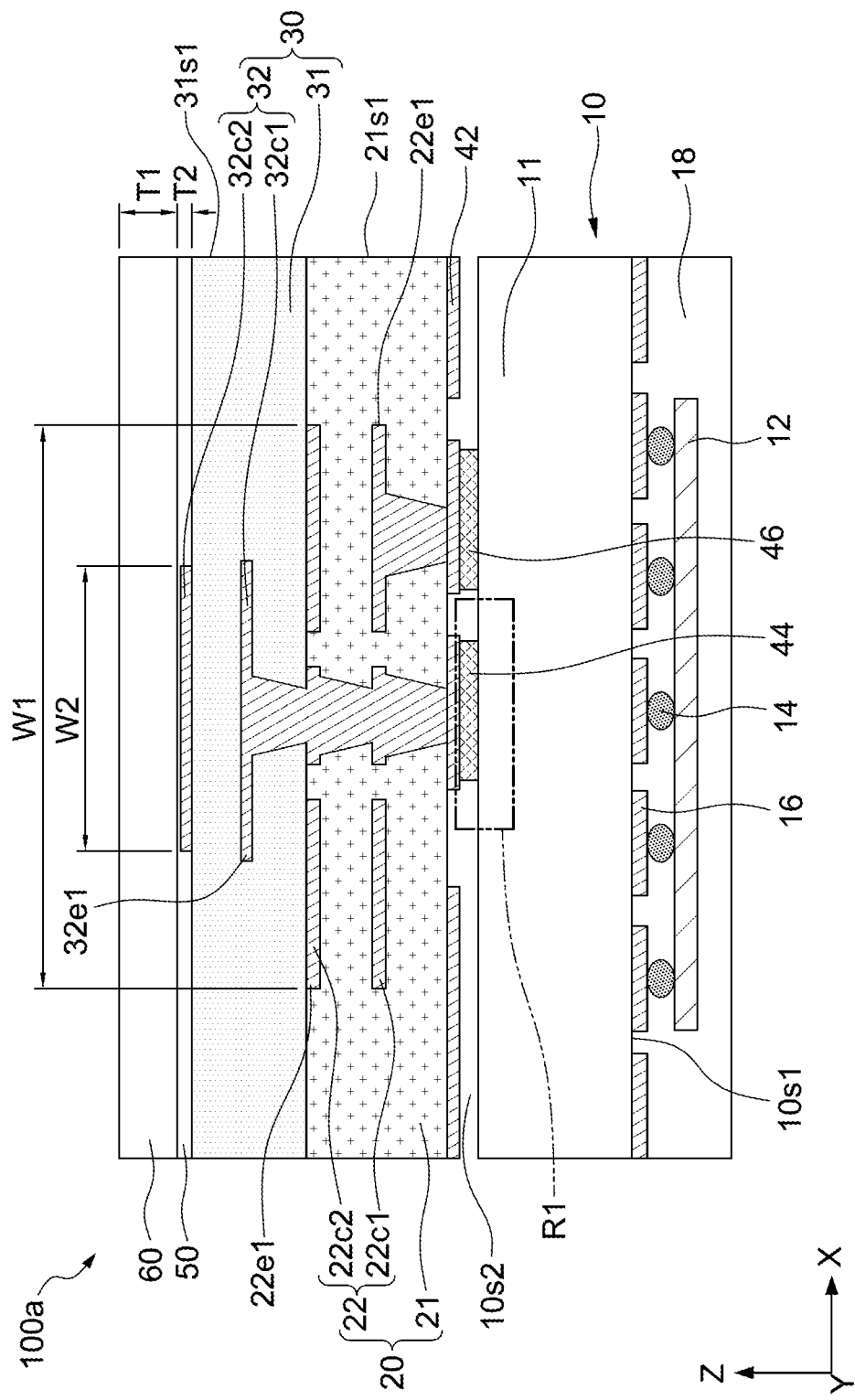
FIG. 1A is a cross-sectional view of an electronic device, in accordance with an embodiment of the present disclosure.

Common reference numerals are used throughout the drawings and the detailed description to indicate the same or similar components. Embodiments of the present disclosure will be readily understood from the following detailed description taken in conjunction with the accompanying drawings.

The following disclosure provides many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

FIG. 1A is a cross-sectional view of an electronic device 100a, in accordance with an embodiment of the present disclosure. In some embodiments, the electronic device 100a may be or include, for example, an antenna device or an antenna package. In some embodiments, the electronic device 100a may be or include, for example, a wireless device, such as a user equipment (UE), a mobile station, a mobile device, an apparatus communicating with the Internet of Things (IoT), etc. In some embodiments, the electronic device 100a may be or include a portable device.

In some embodiments, the electronic device 100a may include a circuit structure 10 (which may also be referred to as a carrier). The circuit structure 10 may have a surface 10s1 and a surface 10s2 opposite to the surface 10s1. The surface 10s1 may also be referred to as a lower surface. The surface 10s2 may also be referred to as an upper surface.

In some embodiments, the circuit structure 10 may be or include, for example, a substrate. In some embodiments, the circuit structure 10 may include, for example, a printed circuit board (PCB), such as a paper-based copper foil laminate, a composite copper foil laminate, or a polymer-impregnated glass-fiber-based copper foil laminate. In some embodiments, the circuit structure 10 may include an insulating layer 11. In some embodiments, the insulating layer 11 may include pre-impregnated composite fibers (e.g., pre-preg). Examples of a pre-preg may include, but are not limited to, a multi-layer structure formed by stacking or laminating a number of pre-impregnated materials/sheets. In some embodiments, a dielectric constant (dk) of the insulating layer 11 may range from about 3 to 5, such as 3, 3.2, 3.4, 3.6, 3.8, 4, 4.2, 4.4, 4.6, 4.8, or 5.

In some embodiments, the circuit structure 10 may include one or more redistribution layers (not shown) in the insulating layer 11. The redistribution layer may include conductive pad(s), trace(s), via(s), layer(s), or other interconnection(s). For example, the circuit structure 10 may include one or more transmission lines (e.g., communications cables) and one or more grounding lines and/or grounding planes. For example, the circuit structure 10 may include one or more conductive pads in proximity to, adjacent to, or embedded in and exposed at the surface 10s1 and/or the surface 10s2 of the circuit structure 10.

The circuit structure 10 may include a solder resist (not shown) on the surface 10s1 and/or the surface 10s2 to fully expose or to expose at least a portion of the conductive pads (e.g., 16) for electrical connections.

In some embodiments, the electronic device 100a may include an electronic component 12. The electronic component 12 may be adjacent to or disposed on the surface 10s1 of the circuit structure 10. The electronic component 12 may be electrically connected to one or more other electrical components (if any) and to the circuit structure 10 (e.g., to the interconnection(s)), and the electrical connection may be attained by way of flip-chip, wire-bond techniques, metal to metal bonding (such as Cu to Cu bonding), or hybrid bonding. In some embodiments, the electronic component 12 may be electrically connected to the circuit structure 10 through conductive element 14. In some embodiments, the conductive element 14 may include, for example, a solder material, such as alloys of gold and tin solder or alloys of silver and tin solder.

The electronic component 12 may be a chip or a die including a semiconductor substrate, one or more integrated circuit (IC) devices and one or more overlying interconnection structures therein. The IC devices may include active devices such as transistors and/or passive devices such as resistors, capacitors, inductors, or a combination thereof. For example, the electronic component 12 may include a system on chip (SoC). For example, the electronic component 12 may include a radio frequency integrated circuit (RFIC), an application-specific IC (ASIC), a central processing unit (CPU), a microprocessor unit (MPU), a graphics processing unit (GPU), a microcontroller unit (MCU), a field-programmable gate array (FPGA), or another type of IC.

Although there is one electronic component in FIG. 1A, the number of electronic components is not limited thereto. In some embodiments, there may be any number of electronic components depending on design requirements.

In some embodiments, the electronic device 100a may include an encapsulant 18. In some embodiments, the encapsulant 18 may be disposed on or adjacent to the surface 10s1 of the circuit structure 10. The encapsulant 18 may include insulation or dielectric material. In some embodiment, the encapsulant 18 may be made of molding material that may include, for example, a Novolac-based resin, an epoxy-based resin, a silicone-based resin, or other another suitable encapsulant. Suitable fillers may also be included, such as powdered $SiO_2$.

In some embodiments, the electronic device 100a may include an antenna component 20. The antenna component 20 may be disposed on or adjacent to the surface 10s2 of the circuit structure 10. In some embodiments, the antenna component 20 may be configured to radiate and/or receive electromagnetic signals, such as radio frequency (RF) signals. For example, the antenna component 20 may be configured to operate in a frequency between about 10 GHz and about 40 GHz, such as 10 GHz, 20 GHz, 30 GHz, or 40 GHz. In some embodiments, the antenna component 20 may include an insulating layer 21 and an antenna pattern 22. In some embodiment, the antenna component 20 may be configured to operate in a frequency between about 30 GHz and about 300 GHz. In some embodiment, the antenna component 20 may be configured to operate in a frequency between about 300 GHz and about 10 THz.

In some embodiments, a dielectric constant of the insulating layer 21 of the antenna component 20 may be greater than that of the insulating layer 11 of the circuit structure 10. In some embodiments, the dielectric constant of the insulating layer 21 may range from about 5 to about 10, such as 5, 6, 7, 8, 9, or 10. The insulating layer 21 may include pre-impregnated composite fibers or ceramic-filled polytetrafluoroethylene (PTFE) composites.

In some embodiments, the antenna pattern 22 may include a multilayer stack. In some embodiments, the antenna pattern 22 may include a patch 22c1 and a patch 22c2, both of which are located at different horizontal levels and spaced apart by a predetermined distance. For example, the patch 22c1 may be located at a lower horizontal level and closer to the circuit structure 10 than the patch 22c2. The patch 22c1 and/or the patch 22c2 may be partially or fully within the insulating layer 21. In some embodiments, an upper surface (not annotated in the figures) of the patch 22c2 may be exposed from the insulating layer 21. In some embodiments, the patch 22c1 may be coupled to the patch 22c2. The patch 22c1 and/or 22c2 may include conductive material(s), such as copper (Cu), tungsten (W), ruthenium (Ru), iridium (Ir), nickel (Ni), osmium (Os), ruthenium (Rh), aluminum (Al), molybdenum (Mo), cobalt (Co), alloys thereof, combinations thereof or any metallic materials.

In some embodiments, the electronic device 100a may include an antenna component 30. The antenna component 30 may be disposed on or adjacent to the antenna component 20. In some embodiments, the antenna component 20 may be disposed between the circuit structure 10 and the antenna component 30. In some embodiments, the antenna component 30 may be configured to radiate and/or receive electromagnetic signals different from the electromagnetic signals of the antenna component 20. In some embodiments, the antenna components 20 and 30 may have different frequencies (or operating frequencies) or bandwidths (or operating bandwidths). For example, the antenna components 20 and 30 may be configured to operate at different frequencies. For example, the antenna component 30 may be operated at a frequency higher than the antenna component 20. In some embodiments, the antenna component 30 may support fifth generation (5G) communications, such as Sub-6 GHz frequency bands and/or millimeter (mm) wave frequency bands. For example, the antenna component 30 may incorporate both Sub-6 GHz antennas and mm wave antennas. In some embodiments, the antenna component 30 may support beyond-5G or 6G communications, such as terahertz (THz) frequency bands. In some embodiments, the antenna component 30 may include an insulating layer 31 and an antenna pattern 32.

In some embodiments, a surface 31$s$1 (or a lateral surface) of the insulating layer 31 may be substantially coplanar with a surface 21$s$1 (or a lateral surface) of the insulating layer 21. In some embodiments, a dielectric constant of the insulating layer 31 of the antenna component 30 may be less than that of the insulating layer 11 of the circuit structure 10. In some embodiments, the dielectric constant of the insulating layer 31 of the antenna component 30 may be less than that of the insulating layer 21 of the antenna component 20. In some embodiments, the dielectric constant of the insulating layer 31 may range from about 1 to about 3, such as 1, 1.5, 2, 2.5, or 3. The insulating layer 31 may include pre-impregnated composite fibers, liquid crystal polymer laminate, ceramic-filled PTFE composites or polyimide-based films.

In some embodiments, the antenna pattern 32 may include a multilayer stack. In some embodiments, the antenna pattern 32 may include a patch 32$c$1 and a patch 32$c$2, both of which are located at different horizontal levels and spaced apart by a predetermined distance. For example, the patch 32$c$1 may be located at a lower horizontal level and closer to the antenna component 20 than the patch 32$c$2. In some embodiments, the antenna pattern 32 may be partially within (or over) the insulating layer 31. For example, the patch 32$c$1 may be fully within the insulating layer 31, and the patch 32$c$2 may be partially within or outside the insulating layer 31. In some embodiments, an upper surface (not annotated in the figures) and a lateral surface (not annotated in the figures) of the patch 32$c$2 may be exposed from the insulating layer 31. In some embodiments, the patch 32$c$1 may be coupled to the patch 32$c$2. The patch 32$c$1 and/or 32$c$2 may include conductive material(s), such as copper, tungsten, ruthenium, iridium, nickel, osmium, ruthenium, aluminum, molybdenum, cobalt, alloys thereof, combinations thereof or any metallic materials.

In some embodiments, the antenna patterns 22 and 32 may be configured to operate at different frequencies. For example, the antenna pattern 32 may be configured to operate at a frequency higher than that of the antenna pattern 22. The patch 22$c$1 and/or 22$c$2 of the antenna pattern 22 may have a dimension or a width W1 in the xy-plane. The patch 32$c$1 and/or 32$c$2 of the antenna pattern 32 may have a dimension or a width W2 in the xy-plane. In some embodiments, the width W2 is less than the width W1. In some embodiments, a vertical projection, along Z-axis, of the lateral edge 32$e$1 of the patch 32$c$1 and/or 32$c$2 of the antenna pattern 32 on the circuit structure 10 may be located within an area defined by a vertical projection of the lateral edge 22$e$1 of the patch 22$c$1 and/or 22$c$2 of the antenna pattern 22 on the circuit structure 10. In some embodiments, the lateral edge 22$e$1 of the patch 22$c$1 and/or 22$c$2 of the antenna pattern 22 may extend beyond or exceeding the lateral edge 32$e$1 of the patch 32$c$1 and/or 32$c$2 of the antenna pattern 32.

In some embodiments, the antenna components 20 and 30 may be regarded as an antenna component or an antenna unit.

In some embodiments, the electronic device 100$a$ may include a feeding pattern 42. The feeding pattern 42 may include traces (not shown), embedded in a dielectric layer, and electrically connected to the antenna pattern 20 and/or 30. In some embodiments, the feeding pattern 42 may be disposed between the circuit structure 10 and the antenna component 20. In some embodiments, the feeding pattern 42 may be electrically connected to the antenna pattern 22 of the antenna component 20, and provide a feed signal to the antenna pattern 22. In some embodiments, the feeding pattern 42 may be electrically connected to the antenna pattern 32 of the antenna component 30, and provide a feed signal to the antenna pattern 32. The material of the feeding pattern 42 may be the same as or similar to that of the antenna pattern 22. In some embodiments, the feeding pattern, not connected to conductive elements (e.g., 44 and/or 46), may be electrically connected to ground.

In some embodiments, the electronic device 100$a$ may include conductive elements 44 and 46. Each of the conductive elements 44 and 46 may be disposed between the circuit structure 10 and the feeding pattern 42. In some embodiments, the conductive element 44 may electrically connect the antenna pattern 32 of the antenna component 30 and the circuit structure 10. In some embodiments, the conductive element 46 may electrically connect the antenna pattern 22 of the antenna component 20 and the circuit structure 10. Each of the conductive elements 44 and 46 may include, for example, a conductive filler, a solder material, a metal, or other suitable materials.

In some embodiments, the electronic device 100$a$ may include a protective layer 50. In some embodiments, the protective layer 50 may be disposed on or adjacent to the antenna component 30. In some embodiments, the protective layer 50 may include a solder resist layer, which may cover an upper surface and a lateral surface (not annotated in the figures) of the patch 32$c$2 to protect the patch 32$c$2. In some embodiments, the patch 32$c$2 of the antenna pattern 32 may be partially or fully within the protective layer 50. In some embodiments, the protective layer 50 may cover the patch 32$c$2 of the antenna pattern 32.

In some embodiments, the electronic device 100$a$ may include an encapsulant 60. In some embodiments, the encapsulant 60 may be disposed on or adjacent to the protective layer 50. In some embodiments, the encapsulant 60 may cover the protective layer 50. In some embodiments, the encapsulant 60 may cover the antenna components 30 and 20. In some embodiments, the encapsulant 60 may be configured to increase, for example, the bandwidth of the antenna frequency of the antenna pattern 22 and/or 32. In some embodiments, a dielectric constant of the encapsulant 60 may be greater than that of the insulating layer 21 of the antenna component 20. In some embodiments, the thickness T1 of the encapsulant 60 may be greater than the thickness T2 of the protective layer 50. In some embodiments, the dielectric constant of the encapsulant 60 may range from about 5 to about 20, such as 5, 5.5, 6, 6.5, 7, 7.5, 8, 8.5, 9, 9.5, 10, 12, 14, 15, 17, 19 and 20.

Figure 1B:
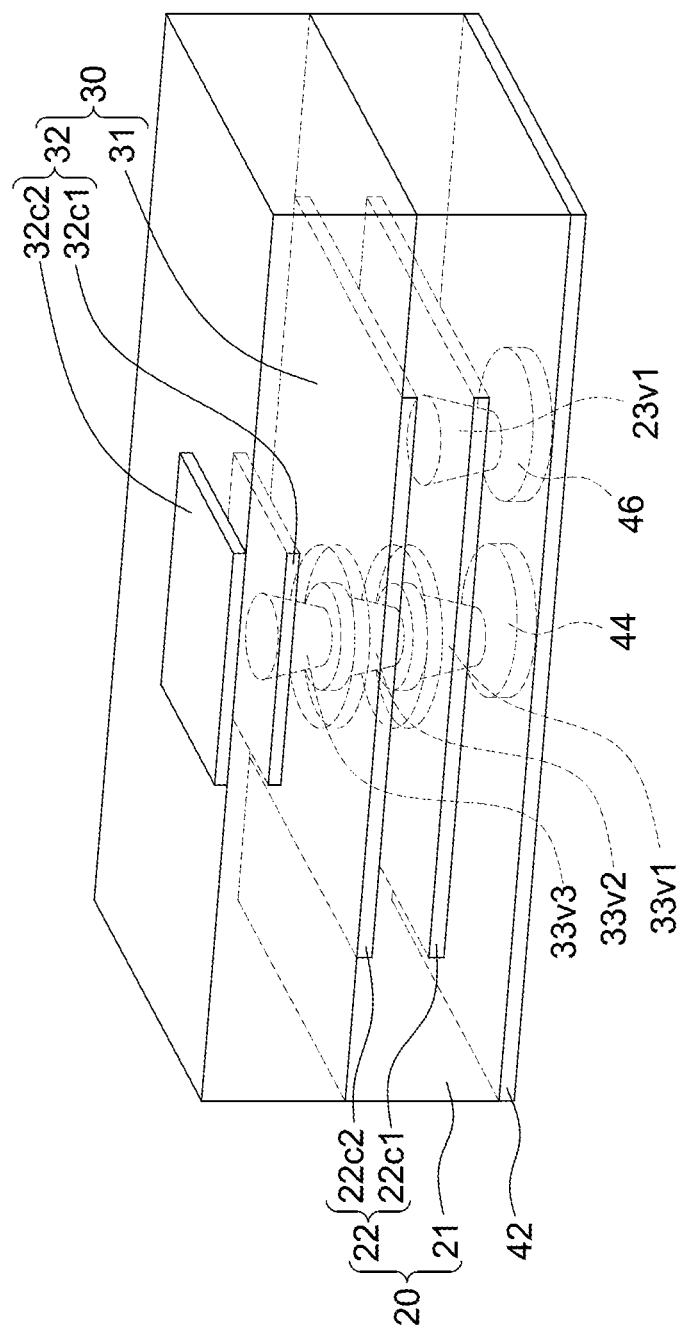
FIG. 1B is a perspective view of the electronic device as shown in FIG. 1A, in accordance with an embodiment of the present disclosure.

FIG. 1B is a perspective view of the electronic device 100$a$. In some embodiments, the electronic device 100$a$ may include conductive vias 23$v$1, 33$v$1, 33$v$2, and 33$v$3. The conductive vias 23$v$1 and 33$v$1 may be located at the same horizontal level and embedded in the insulating layer 21. The conductive via 33v2 may be disposed over the conductive via 33v1 and embedded in the insulating layer 21. The conductive via 33v3 may be disposed over the conductive via 33v2 and embedded in the insulating layer 31. In some embodiments, the conductive element 44 may be electrically connected to the antenna pattern 32 through the conductive vias 33v1, 33v2, and 33v3. In some embodiments, the conductive element 46 may be electrically connected to the antenna pattern 22 through the conductive via 23v1. In some embodiments, the conductive via 33v1 may be spaced apart from the antenna pattern 22 by the insulating layer 21, which fills the aperture (not annotated in the figures) defined by the patch 22c1. In some embodiments, the conductive via 33v2 may be spaced apart from the antenna pattern 22 by the insulating layer 21, which fills the aperture (not annotated in the figures) defined by the patch 22c2. Further, the feeding pattern 42 may include openings or holes (not shown in FIG. 1B) therein to meet the design requirement.

In a comparative example, both the high and the lower frequency antennas are disposed in the same insulating material. Either the antenna gain or the dimension of the antenna pattern may not satisfy the current requirement. According to some embodiments of the present disclosure, the higher frequency antenna (e.g., the antenna pattern 32) and the lower frequency antenna (e.g., the antenna pattern 22) are disposed within different insulating materials. In this embodiment, the lower frequency antenna is disposed in an insulating material (e.g., insulating layer 21) with a relatively high dielectric constant, which can thereby reduce the dimension or width (e.g., W1) of the antenna pattern 22. The higher frequency antenna is disposed in an insulating material (e.g., insulating layer 31) with a relatively low dielectric constant, which can thereby enhance the antenna gain by at least 1 dB.

Figure 2:
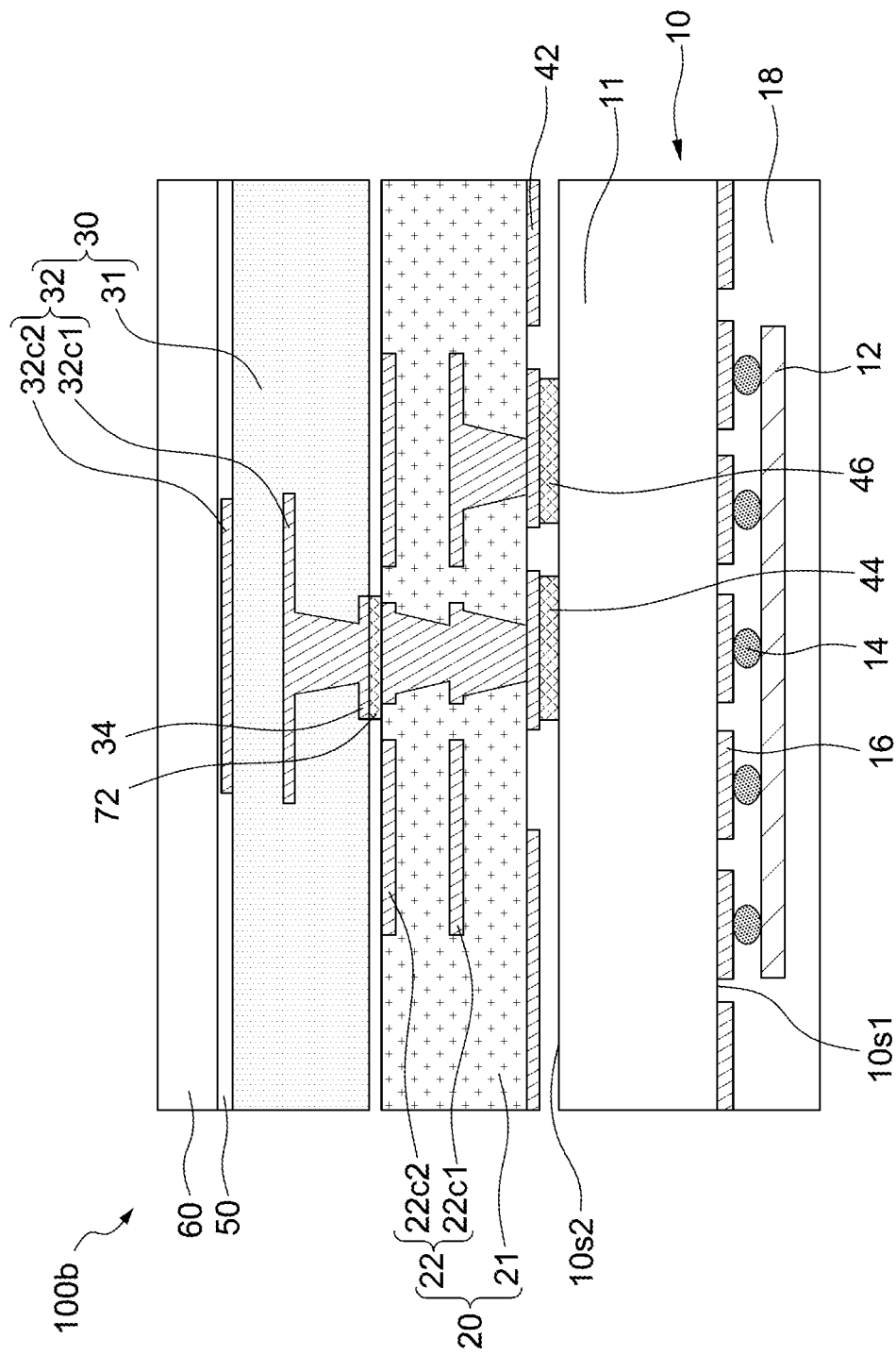
FIG. 2 is a cross-sectional view of an electronic device, in accordance with an embodiment of the present disclosure.

FIG. 2 is a cross-sectional view of an electronic device 100b, in accordance with an embodiment of the present disclosure. The electronic device 100b is similar to the electronic device 100a as shown in FIG. 1A, and the differences therebetween are described below.

In some embodiments, the electronic device 100b may include a pad 34 and a conductive element 72. In some embodiments, the pad 34 may be disposed on or adjacent to the antenna component 30. The pad 34 may include metal, such as copper, tungsten, ruthenium, iridium, nickel, osmium, ruthenium, aluminum, molybdenum, cobalt, alloys thereof, combinations thereof or any metallic materials.

In some embodiments, the conductive element 72 may be disposed between the antenna components 20 and 30. The conductive element 72 may be disposed on and adjacent to an upper surface of the antenna component 20. In some embodiments, the conductive element 72 may include a solder material, such as alloys of gold and tin solder or alloys of silver and tin solder. In some embodiments, the conductive element 72 may include conductive fillers.

In some embodiments, the antenna components 20 and 30 may be manufactured separately, and then integrated by the pad 34 and/or conductive element 72, which can thereby simplify the manufacturing process.

Figure 3:
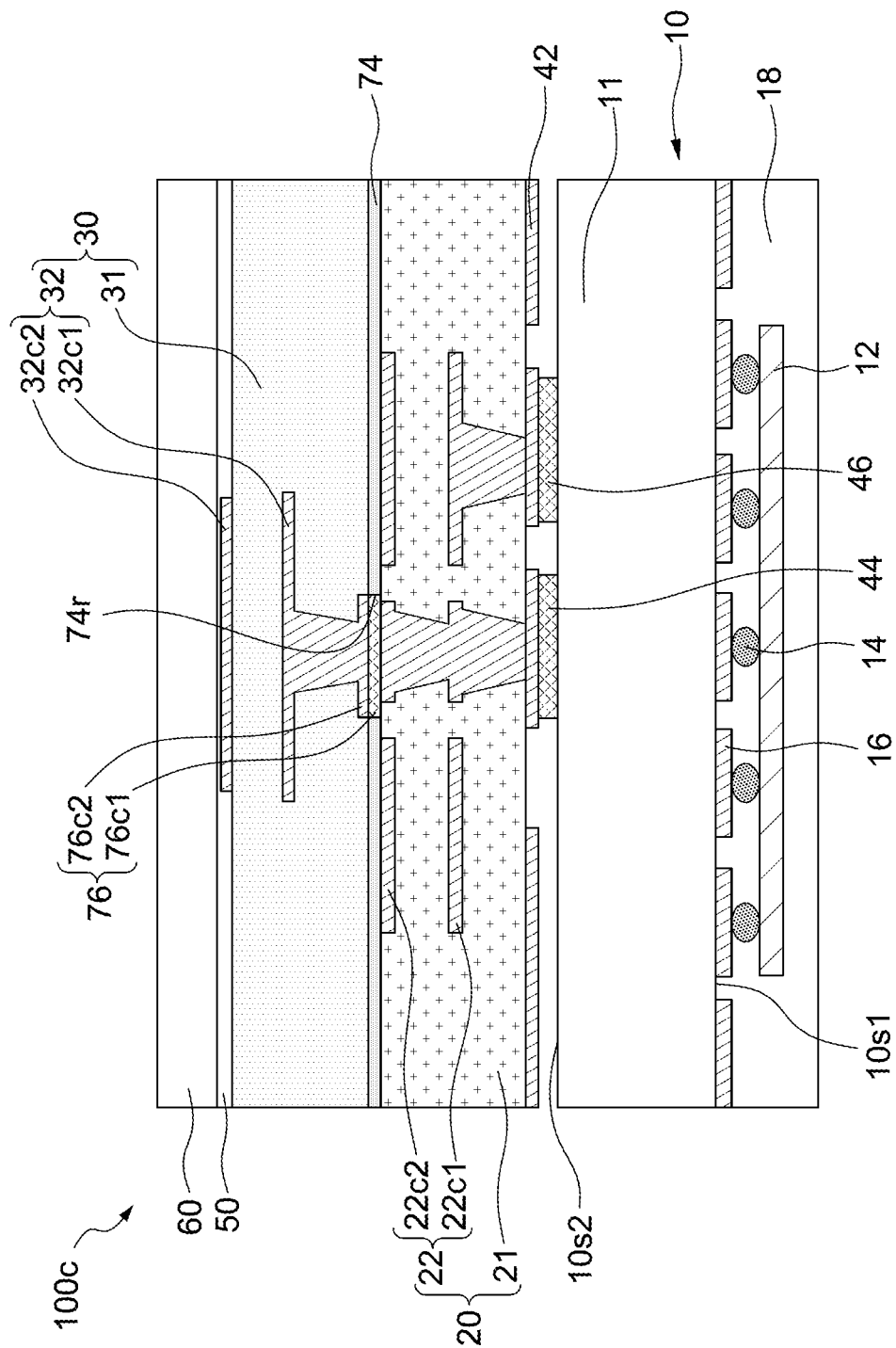
FIG. 3 is a cross-sectional view of an electronic device, in accordance with an embodiment of the present disclosure.

FIG. 3 is a cross-sectional view of an electronic device 100c, in accordance with an embodiment of the present disclosure. The electronic device 100c is similar to the electronic device 100a as shown in FIG. 1A, and the differences therebetween are described below.

In some embodiments, the electronic device 100c may include a bonding layer 74 and a conductive element 76. In some embodiments, the bonding layer 74 may be disposed between the antenna components 20 and 30. In some embodiments, the bonding layer 74 may physically separate the antenna component 20 from the antenna component 30. The bonding layer 74 may include an adhesive, a glue, an underfill, or other suitable materials. In some embodiments, a dielectric constant of the bonding layer 74 is different from the dielectric constant of the insulating layer 21 of the antenna component 20. In some embodiments, the dielectric constant of the bonding layer 74 is different from the dielectric constant of the insulating layer 31 of the antenna component 30.

In some embodiments, the conductive element 76 may be disposed between the antenna components 20 and 30. In some embodiments, the conductive element 76 may be located within a through via 74r defined by the bonding layer 74. The conductive element 76 may include an electrical connection 76c1 and a pad 76c2. The electrical connection 76c1 may be disposed on and adjacent to the antenna component 20. The electrical connection 76c1 may include a solder material, such as alloys of gold and tin solder or alloys of silver and tin solder. The pad 76c2 may be disposed on or adjacent to the antenna component 30. The material of the pad 76c2 may be the same as or similar to that of the pad 34.

In some embodiments, the antenna components 20 and 30 may be manufactured separately, and then integrated by the bonding layer 74 and/or conductive element 76, which can thereby simplify the manufacturing process. In addition, the bonding layer 74 can prevent delamination between the antenna components 20 and 30.

Figure 4:
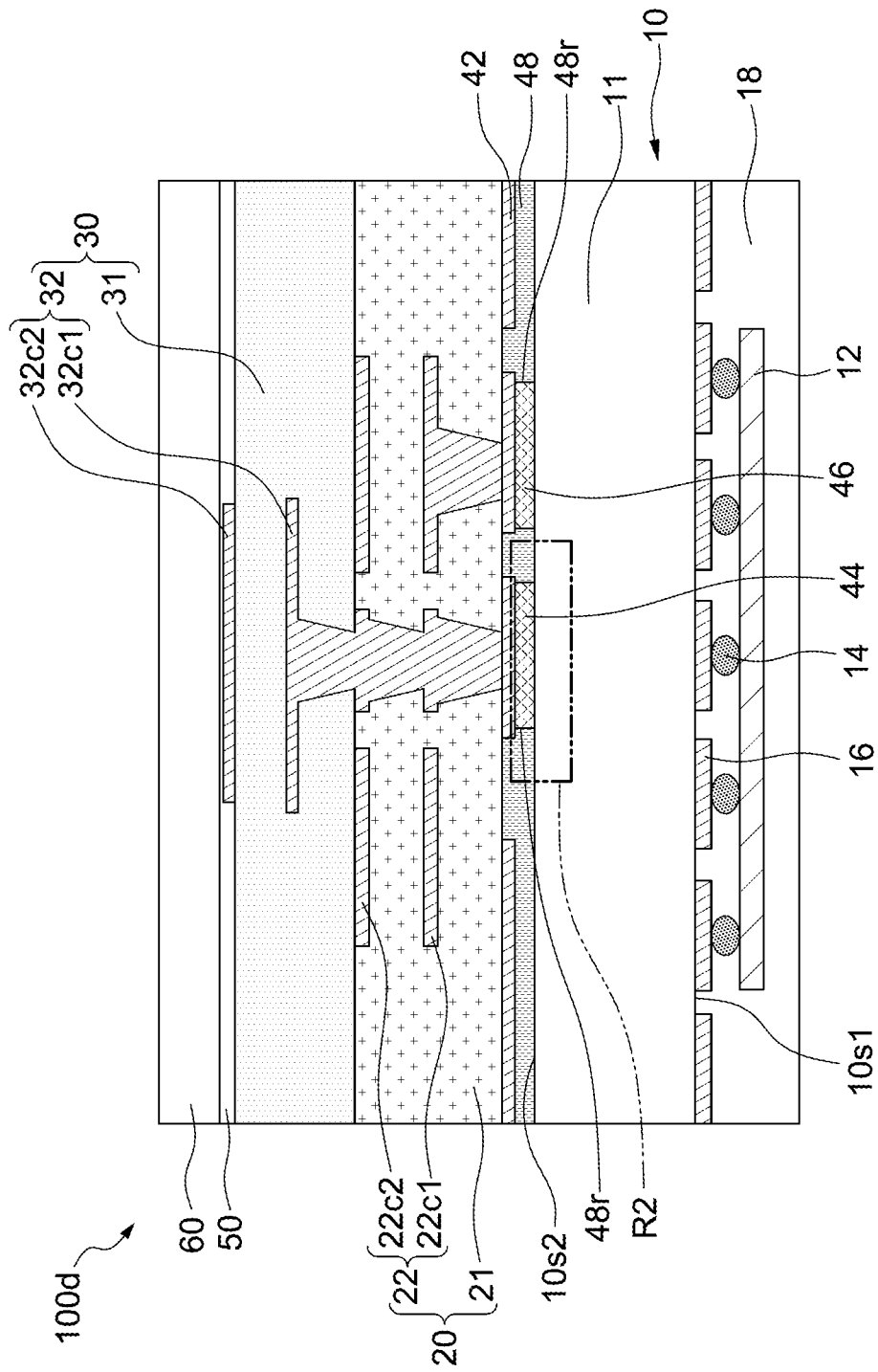
FIG. 4 is a cross-sectional view of an electronic device, in accordance with an embodiment of the present disclosure.

FIG. 4 is a cross-sectional view of an electronic device 100d, in accordance with an embodiment of the present disclosure. The electronic device 100d is similar to the electronic device 100a as shown in FIG. 1A, and the differences therebetween are described below.

In some embodiments, the electronic device 100d may include a bonding layer 48. In some embodiments, the bonding layer 48 may be disposed between the circuit structure 10 and the antenna component 20. The bonding layer 48 may include, for example, an adhesive, a glue, an underfill, or other suitable materials. The bonding layer 48 may define a plurality of through vias 48r for accommodating conductive materials, such as the conductive elements 44 and 46.

In some embodiments, the circuit structure 10 and 20 may be manufactured separately, and then integrated by the bonding layer 48, which can thereby simplify the manufacturing process. In addition, the bonding layer 48 can prevent delamination between the circuit structure 10 and the antenna component 20.

Figure 5:
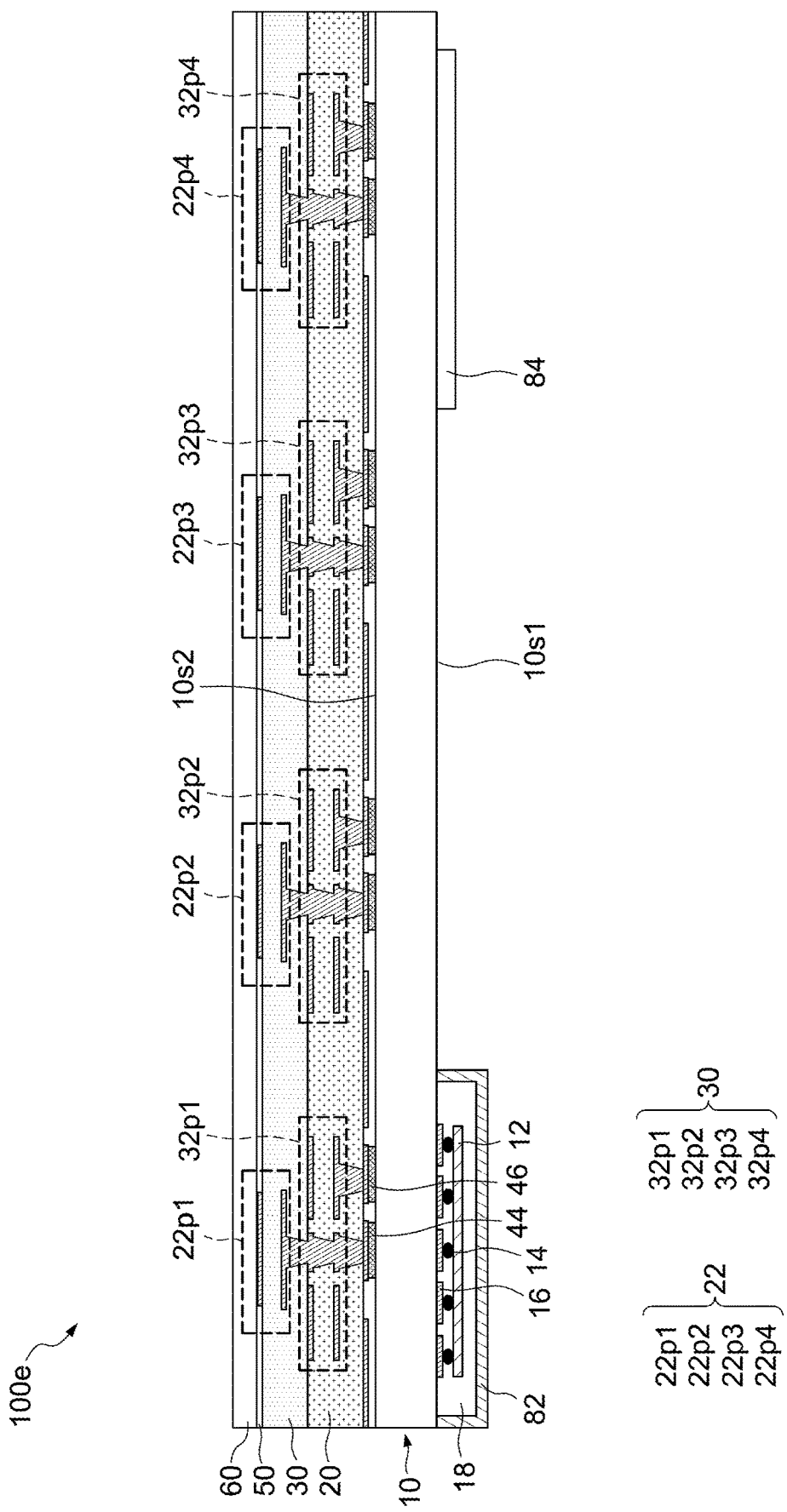
FIG. 5 is a cross-sectional view of an electronic device, in accordance with an embodiment of the present disclosure.

FIG. 5 is a cross-sectional view of an electronic device 100e, in accordance with an embodiment of the present disclosure. The electronic device 100e is similar to the electronic device 100a as shown in FIG. 1A, and the differences therebetween are described below.

In some embodiments, the antenna pattern 22 can include a plurality of antenna units 22p1, 22p2, 22p3, and 22p4. In some embodiments, the antenna pattern 32 can include a plurality of antenna units 32p1, 32p2, 32p3, and 32p4. Each of the antenna units 22p1, 22p2, 22p3, and 22p4 may be vertically aligned to the corresponding antenna units 32p1, 32p2, 32p3, and 32p4, respectively. In some embodiments, each of the antenna units 22p1, 22p2, 22p3, and 22p4 may be operated in different frequencies. In some embodiments, each of the antenna units 32p1, 32p2, 32p3, and 32p4 may be operated in different frequencies.

In some embodiments, the electronic device 100e may include a shielding layer 82. In some embodiments, the shielding layer 82 may be disposed on the surface 10s1 of the circuit structure 10. The shielding layer 82 may be disposed on the external surfaces of the encapsulant 18. In some embodiments, the shielding layer 82 may be configured to provide an electromagnetic interference (EMI) shielding protection. For example, the shielding layer 82 may be configured to provide an EMI shielding to prevent the electronic component 12 from being interfered with by other electronic components, and vice versa. In some embodiments, the shielding layer 82 may include copper (Cu) or other conductive materials, such as aluminum (Al), chromium (Cr), tin (Sn), gold (Au), silver (Ag), nickel (Ni) or stainless steel, another metal, or a mixture, an alloy, or other combinations of two or more thereof. In some embodiments, the shielding layer 82 may be or include a conductive layer or a conductive thin film. In some embodiments, the shielding layer 82 may be or include a multi-layered structure. For example, layers of the shielding layer 82 from the inside to the outside may include a seed layer (such as porous stainless steel, SUS), a conductive layer (such as Cu), and a protection layer (such as SUS).

In some embodiments, the electronic device 100e may include a connector 84. In some embodiments, the connector 84 may be disposed on the surface 10s1 of the circuit structure 10. In some embodiments, the connector 84 may vertically overlap at least one of the antenna units 22p1, 22p2, 22p3, or 22p4. In some embodiments, the connector 84 may vertically overlap at least one of the antenna units 32p1, 32p2, 32p3, or 32p4. The connector 84 may be spaced apart from the encapsulant 18. The connector 84 may be configured to provide external connections. For example, the connector 84 can provide electrical connections between the electronic device 100e and external components (e.g., external circuits or circuit boards). In some embodiments, the connector 84 may include a conductive pillar, a solder ball, a conductive wire, a board-to-board connector, a connector for HotBar soldering, a combination thereof, or any other feasible connectors.

FIG. 6A is an enlarged view of region R1 as shown in FIG. 1A, in accordance with an embodiment of the present disclosure. In some embodiments, the circuit structure 10 may include a passivation layer 112 (e.g., a solder resist) on the insulating layer 11. The upper surface of the passivation layer 112 may be defined as the surface 10s2 of the circuit structure 10. In some embodiments, the circuit structure 10 may include a pad 114 on the insulating layer 11. In some embodiments, the pad 114 may be spaced apart from the passivation layer 112. In some embodiments, the conductive element 44 may include a solder material 44a. In some embodiments, the solder material 44a may cover a portion of the passivation layer 112. In some embodiments, the solder material 44a may be electrically connected to the pad 114. In some embodiments, the solder material 44a may fill the gap (not annotated in the figures) between the pad 114 and the passivation layer 112.

FIG. 6B is a cross-sectional view of an electronic device, in accordance with an embodiment of the present disclosure. In some embodiments, a portion of an upper surface (not annotated in the figures) of the insulating layer 11 is exposed by the solder material 44a. In some embodiments, the solder material 44a is spaced apart from the passivation layer 112. In some embodiments, a gap (not annotated in the figures) between the passivation layer 112 and the solder material 44a may be filled with a dielectric material (e.g., an underfill, not shown in FIG. 6B) or other suitable materials.

FIG. 6C is a cross-sectional view of an electronic device, in accordance with an embodiment of the present disclosure. In some embodiments, the passivation layer 114 may cover a portion of the pad 114. The solder material 44a may be spaced apart from a lateral surface of the pad 114.

Figure 7A:
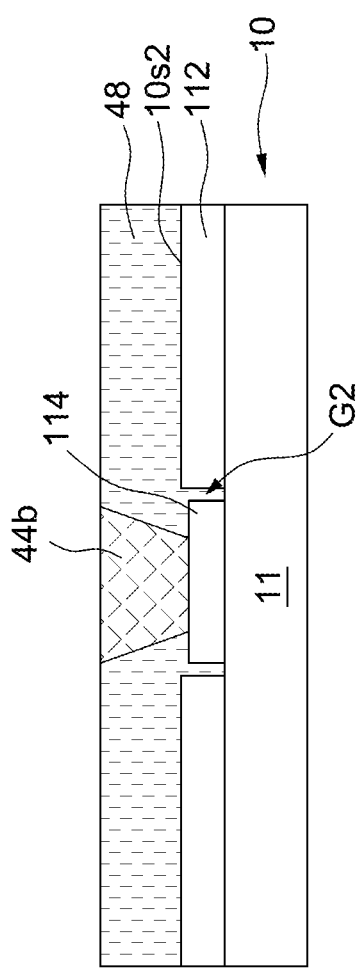
FIG. 7A is an enlarged view of region R2 as shown in FIG. 4, in accordance with an embodiment of the present disclosure.

FIG. 7A is an enlarged view of region R2 as shown in FIG. 4, in accordance with an embodiment of the present disclosure. In some embodiments, a gap G2 may be disposed between the pad 114 and the passivation layer 112. In some embodiment, the bonding layer 48 may fill the gap G2. In some embodiments, the conductive element 44 may include a via 44b. In some embodiments, the via 44b may include a conductive paste, such as a copper paste. The via 44b may penetrate the bonding layer 48. The via 44b may be electrically connected to the pad 114. In some embodiments, the bonding layer 48 may be in contact with the lateral surface of the pad 114.

Figure 7B:
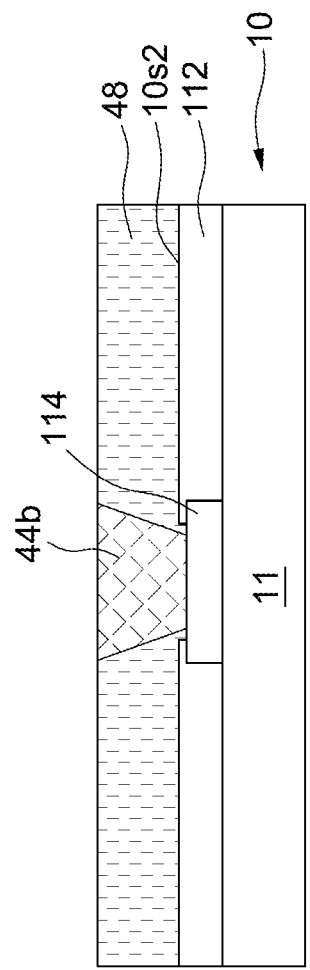
FIG. 7B is a cross-sectional view of an electronic device, in accordance with an embodiment of the present disclosure.

FIG. 7B is a cross-sectional view of an electronic device, in accordance with an embodiment of the present disclosure. In some embodiments, a portion of the pad 114 may be covered by the passivation layer 112. In some embodiments, the bonding layer 48 may be spaced apart from the lateral surface of the pad 114.

Figure 8A:
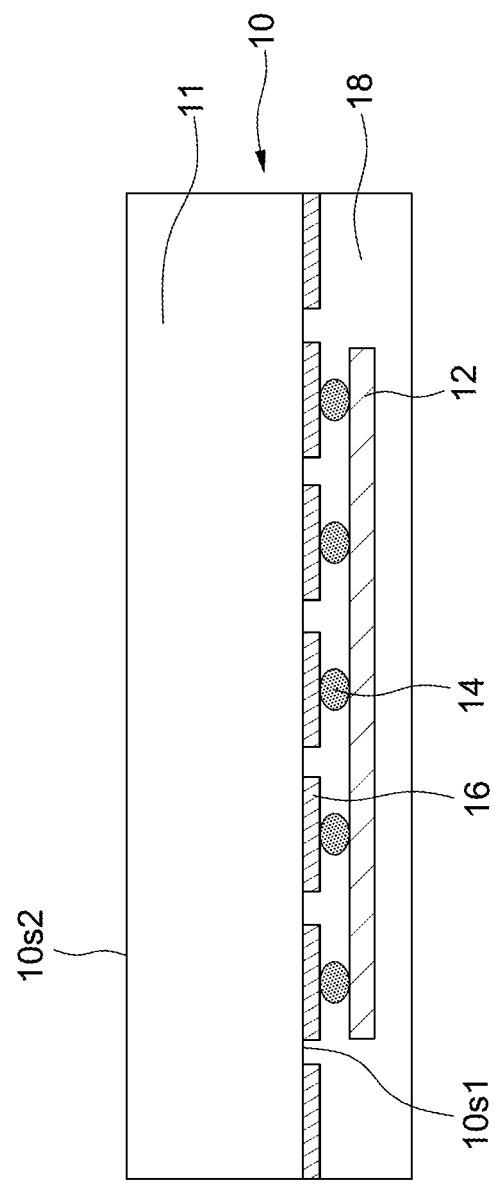
FIG. 8A, FIG. 8B and FIG. 8C illustrate cross-sectional views in one or more stages of a method of manufacturing an electronic device in accordance with an embodiment of the present disclosure.
Figure 8B:
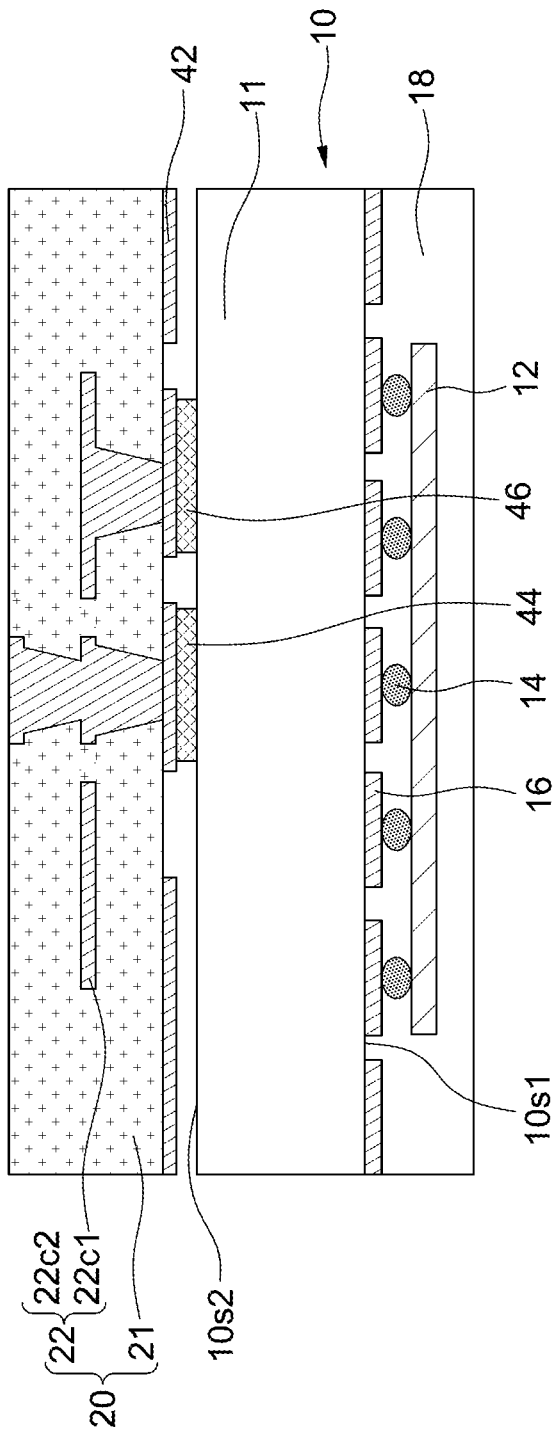
Figure 8C:
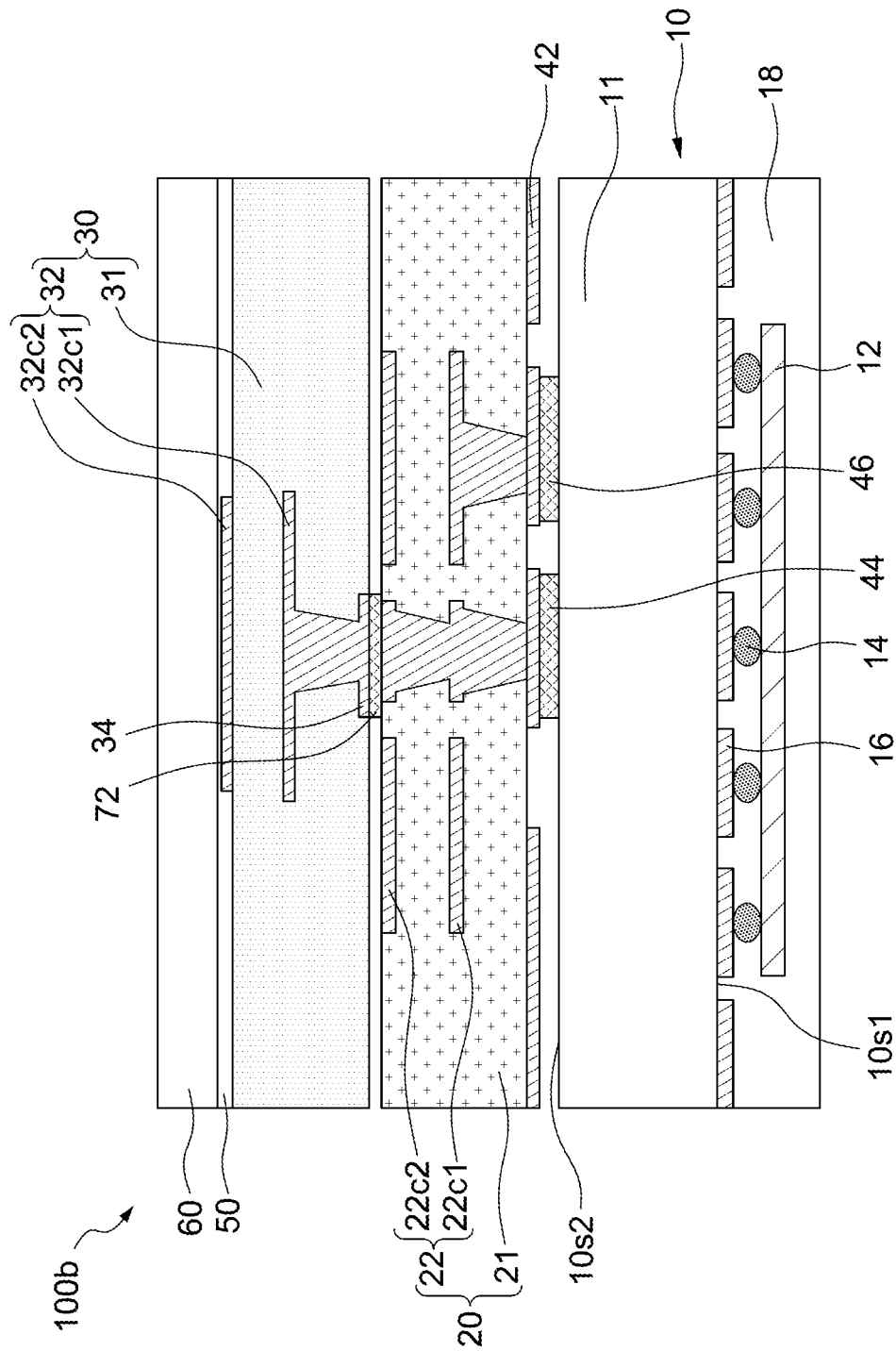

FIG. 8A, FIG. 8B and FIG. 8C illustrate cross-sectional views in one or more stages of a method of manufacturing an electronic device in accordance with an embodiment of the present disclosure. At least some of these figures have been simplified to better understand the aspects of the present disclosure. In some embodiments, the electronic device 100b may be manufactured through the operations described with respect to FIG. 8A, FIG. 8B and FIG. 8C.

Referring to FIG. 8A, the circuit structure 10 may be provided. The circuit structure 10 may have the surface 10s1 and the surface 10s2 opposite to the surface 10s1. The electronic component 12 may be attached to the surface 10s1 of the circuit structure 10. The encapsulant 18 may be formed on the surface 10s1 of the circuit structure 10 and cover the electronic component 12.

In the present embodiment, the circuit structure 10 may include a copper clad laminate (CCL) substrate, which includes several carrier units wherein one may be separable from another by a scribe line (not shown). Since each of the carrier units is subjected to similar or identical processes in the manufacturing method, for convenience, only one exemplary carrier unit is described in detail as follows.

Referring to FIG. 8B, an antenna component 20 may be formed on the surface 10s2 of the circuit structure 10. The antenna component 20 may be attached to the circuit structure 10 through the conductive elements 44 and 46.

Referring to FIG. 8C, an antenna component 30, a protective layer 50, and an encapsulant 60 may be formed on the antenna component 20, thereby producing the electronic device 100b. In some embodiments, the antenna component 30, protective layer 50, and encapsulant 60 may be integrated as a structure, and then this structure may be attached to the antenna component 20 through a conductive element 72. In some embodiments, a reflow process may be performed to cure the solder material, which thereby forms the conductive element 72 between the antenna components 20 and 30.

Figure 9A:
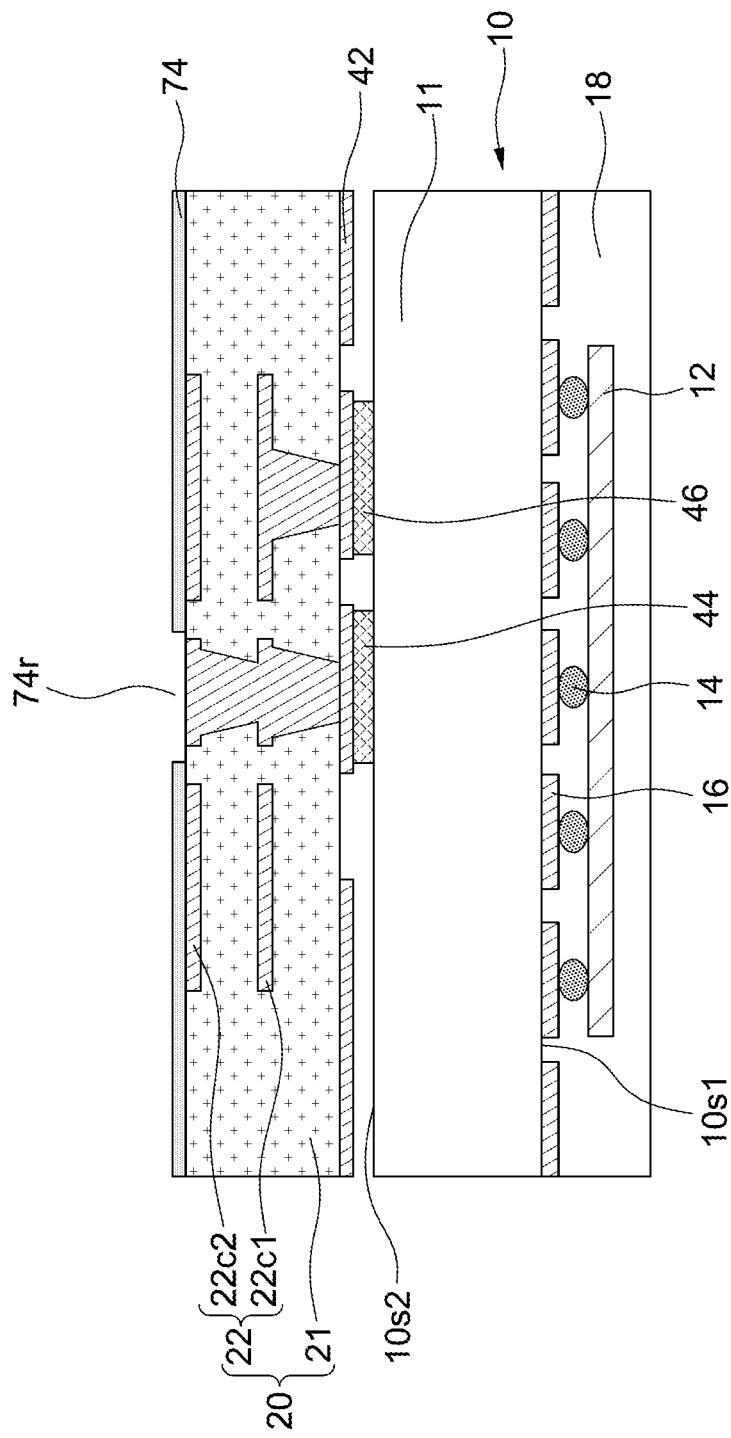
FIG. 9A and FIG. 9B illustrate cross-sectional views in one or more stages of a method of manufacturing an electronic device in accordance with an embodiment of the present disclosure.
Figure 9B:
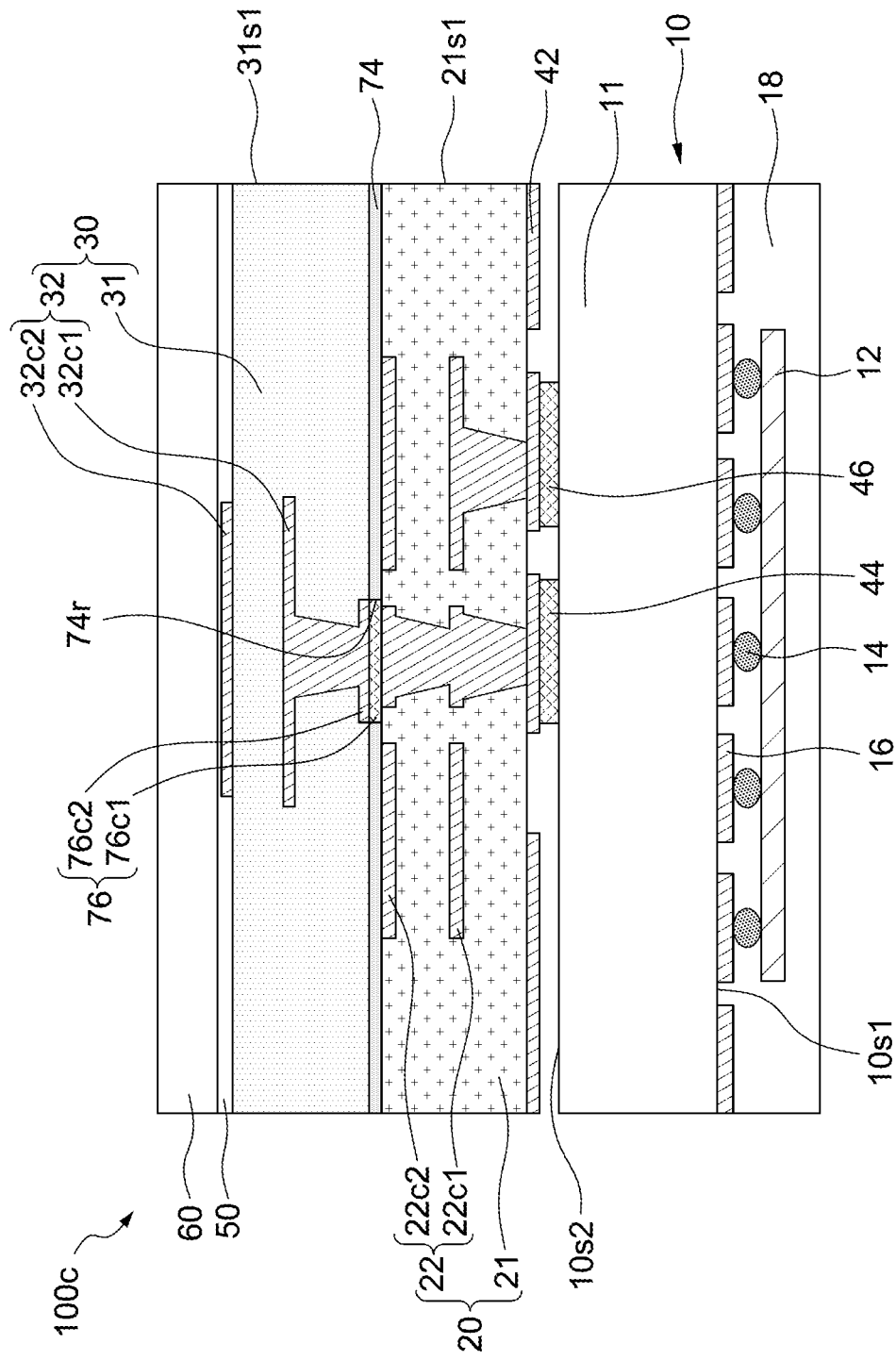

FIG. 9A and FIG. 9B illustrate cross-sectional views of one or more stages of a method of manufacturing an electronic device in accordance with an embodiment of the present disclosure. At least some of these figures have been simplified to better understand the aspects of the present disclosure. In some embodiments, the electronic device 100c may be manufactured through the operations described with respect to FIG. 9A and FIG. 9B.

Referring to FIG. 9A, the operation thereof may be subsequent to the operation of FIG. 8B. A bonding layer 74 may be formed on the antenna component 20. A portion of the bonding layer 74 may be removed to form a through via 74r for accommodating conductive materials.

Referring to FIG. 9B, an antenna component 30, a protective layer 50, and an encapsulant 60 may be formed on the antenna component 20, thereby producing the electronic device 100c. In some embodiments, the antenna component 30, protective layer 50, and encapsulant 60 may be integrated as a structure, and then attached to the antenna component 20 through a conductive element 76, including an electrical connection 76c1 and a pad 76c2.

It is contemplated that if the antenna components 20 and 30 are integrated as an antenna structure, and the said antenna structure, including the antenna components 20 and 30, can be laminated on the circuit structure 10. As a result, an electronic device 100a as shown in FIG. 1A may be formed.

It is contemplated that if the antenna components 20 and 30 are integrated as an antenna structure, and the said antenna structure, including the antenna components 20 and 30, can be bonded to the circuit structure 10 through a bonding layer 48. As a result, an electronic device 100d as shown in FIG. 4 may be formed.

Spatial descriptions, such as "above," "below," "up," "left," "right," "down," "top," "bottom," "vertical," "horizontal," "side," "higher," "lower," "upper," "over," "under," and so forth are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Two surfaces can be deemed to be coplanar or substantially coplanar if a displacement between the two surfaces is no greater than 5 μm, no greater than 2 μm, no greater than 1 μm, or no greater than 0.5 μm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having conductivity greater than approximately 104 S/m, such as at least 105 S/m or at least 106 S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not necessarily be drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. An electronic device, comprising:
a first insulating layer having a first dielectric constant;
a first antenna pattern at least partially disposed over the first insulating layer;
a second insulating layer disposed over the first insulating layer and having a second dielectric constant;
a second antenna pattern at least partially disposed over the second insulating layer;
a circuit structure comprising a third insulating layer which has a third dielectric constant,
wherein a difference between the first dielectric constant and the third dielectric constant is less than a difference between the first dielectric constant and the second dielectric constant;
a first antenna component comprising the first insulating layer and the first antenna pattern, wherein the first antenna component is connected to the circuit structure through a bonding layer; and
a second antenna component comprising the second insulating layer and the second antenna pattern, wherein the second antenna component is connected to the first antenna component through a solder material.

2. The electronic device of claim 1, further comprising:
a conductive element at least partially within the bonding layer and electrically connecting the circuit structure to the first antenna component.

3. The electronic device of claim 2, wherein the conductive element comprises a conductive filler.

4. The electronic device of claim 1, wherein the first antenna component further comprises the second insulating layer and the second antenna pattern.

5. The electronic device of claim 1, wherein the first dielectric constant is less than the second dielectric constant.

6. The electronic device of claim 1, wherein the first antenna pattern is configured to operate at a first frequency, and the second antenna pattern is configured to operate at a second frequency greater than the first frequency.

* * * * *